United States Patent [19]

Onodera et al.

[11] Patent Number: 4,794,281
[45] Date of Patent: Dec. 27, 1988

[54] SPEED-UP CIRCUIT FOR TRANSISTOR LOGIC OUTPUT DEVICE

[75] Inventors: Keith K. Onodera; Alex B. Djenguerian, both of San Jose, Calif.

[73] Assignee: National Semiconductor Corporation, Santa Clara, Calif.

[21] Appl. No.: 822,083

[22] Filed: Jan. 24, 1986

[51] Int. Cl.$^4$ .................. H03K 19/088; H03K 17/16; H03K 3/33; H03K 5/13
[52] U.S. Cl. ..................................... 307/456; 307/443; 307/592; 307/601; 307/605; 307/300
[58] Field of Search ............... 307/456, 443, 591, 592, 307/595, 601, 602, 605, 300, 299 A, 480; 328/55

[56] References Cited

U.S. PATENT DOCUMENTS

| | | | |
|---|---|---|---|
| 1,328 | 1/1883 | Fujitsu | 307/456 |
| 4,365,174 | 12/1982 | Kucharewski | 307/595 |
| 4,628,218 | 12/1986 | Nakaizumi | 307/443 |
| 4,638,187 | 11/1987 | Boler et al. | 307/443 |

FOREIGN PATENT DOCUMENTS 0158626  9/1984  Japan .................. 307/456

Primary Examiner—John S. Heyman
Assistant Examiner—M. R. Wambach
Attorney, Agent, or Firm—Gail W. Woodward; Lee Patch; Mark Aaker

[57] ABSTRACT

A totem-pole transistor circuit in the output stage of a logic device includes, in the base circuit of the current sink transistor, a discharge transistor responsive to each transition of a circuit input signal for discharging the parasitic base capacitance of the sink transistor, and a circuit for delaying the delivery of the input signal to the discharge transistor. The delay results in postponing the transition of the discharge transistor from one operational state to another. This causes the transitions of the discharge transistor to lag the transitions of the totem-pole pair which occur simultaneously with input signal changes. Thus, the discharge transistor is held on for a period of time sufficient to discharge the parasitic capacitance when the current-sink transistor turns off. This speeds up the turn-off of the sink transistor. After the period elapses, the discharge transistor turns off. Then, when base current is supplied to the current-sink transistor to turn it on, the discharge transistor is held off for an amount of time during which all of the base current is provided to the current-sink transistor, causing it to be quickly switched on. Then the discharge transistor is turned on, permitting it to discharge the parasitic capacitance of the current-sink transistor at the next input signal transition.

12 Claims, 3 Drawing Sheets

SPEED-UP CIRCUIT FOR TRANSISTOR LOGIC OUTPUT DEVICE

BACKGROUND OF THE INVENTION

The invention is in the field of transistor logic output circuits for transistor logic devices. In particular, the invention is applicable to the field of TTL circuits employing a "totem-pole" arrangement consisting of a pull-down, current-sink transistor and a pull-up, current-source transistor. The invention increases the speed of operation of the pull-down transistor and precisely phases its operation with that of the pull-up transistor in order to reduce the total AC power consumed by the circuit.

Conventionally, a digital transistor logic output circuit provides, through an output terminal, a voltage signal whose state is determined by the state of a signal input to the circuit. In the typical totem-pole arrangement, the output voltage is developed at the collector of a current-sink transistor. As is known, the transition speeds—the rise and fall times—of the output voltage are determined by the speed with which the current-sink transistor is switched between saturation and non-conduction.

The speed of operation of the current-sink transistor is, in turn, largely affected by its base-collector capacitance. Thus, in turning on the transistor, it is preferable to supply a relatively large current to its base in order to quickly charge the capacitance and place the transistor in operation. Similarly, quickly discharging the capacitance when the base current is removed from the transistor will shorten its turn-off time.

In most prior art logic output circuits, the totem-pole arrangement is driven by a phase-splitter section which responds to the input signal. The current-sink transistor is switched on by a current signal provided to its base by the phase-splitter. The transistor is switched off by removal of the current. In the usual arrangements for speeding up the output transition times of a logic circuit, a discharge element is placed in the base circuit of the current-sink transistor. The discharge element is operated to provide a discharge path for the base-collector capacitance of the sink transistor when the signal current is removed.

It is vital to the efficient and speedy operation of the circuit that the operation of the discharge element be synchronized with that of the phase-splitter. Synchronization prevents the discharge element from providing a parallel path for the diversion of signal current when the sink transistor is being turned on. On the other hand, the diversion element must be active precisely when the input signal changes in a direction requiring that the sink transistor be turned off, in order to prevent the sink transistor from conducting while its base-collector capacitance discharges. Such conduction lengthens the output signal transition and adds to the current load passed by the pull-up element of the totem-pole circuit.

Therefore, there is an evident need in logic output devices employing a totem-pole output circuit to provide for the rapid discharge of the base-collector capacitance of the totem-pole sink transistor and to ensure that this discharge is synchronized to the operation of the pull-up transistor.

SUMMARY OF THE INVENTION

The present invention contemplates a logic circuit having an input terminal for receiving a multi-state input signal and an output terminal to which a capacitive load is connected for receiving an output signal. The logic circuit includes a phase-splitter connected to the input terminal and responsive to the input signal for providing a sink transistor signal current when the input signal transitions from its low to its high state and for removing the current when the signal changes in the opposite direction.

A sink transistor has a collector connected to the output terminal, an emitter, and a base connected to receive the signal current for turning the sink transistor on to conduct current from the output terminal through the collector and emitter when the signal current is provided and for turning the sink transistor off when the signal current is removed.

A switchable current device responsive to the input signal is placed in the base circuit of the sink transistor and is responsive to the input signal for, when the input signal changes from a low to a high state, being switched to a first condition connecting a current path to the base of the sink transistor and for, when the input signal has a negative transition, being switched to a second condition removing the current path.

In the circuit of the invention, the operation of the switchable current device is phased with the operation of the sink transistor by the provision of a delay connected between the input terminal and the switchable current device for delaying the provision of the input signal to the switchable current device. The delay maintains the device in its first condition for an amount of time sufficient to discharge parasitic base capacitance of the sink transistor when the input signal follows its negative-going transition. The delay also maintains the switchable current device in its second condition for substantially the same amount of time when the input signal follows its positive-going transition.

The delay thus maintains the switchable current device in its first condition for a period of time beginning with the negative-going transition of the input signal, which is precisely when the sink transistor must be quickly turned off by discharging its parasitic base capacitance. Thus, there is no delay in providing the discharge path when it is needed, and the sink transistor turns off quickly and draws no current during the positive-going transition of the output signal. Similarly, the delay prevents the switchable current device from being turned on when the input signal transitions from its low to its high state, so that all of the signal current necessary to quickly turn on the sink transistor will be provided to its base. This enables the output transistor to quickly switch on to sink current from the load while the output signal is transitioning from its high to its low state.

Therefore, it is the primary object of the present invention to provide an improved logic output circuit with reduced output signal switching times.

It is a further object of the present invention to provide such a circuit wherein the state transitions of a current sink transistor are precisely synchronized with the complementary action of a pull-up transistor in order to reduce the total power consumed by the circuit.

Other objects and advantages of the present invention will become evident when the following detailed description is read in conjunction with the below-described drawings.

DETAILED DESCRIPTION OF THE PREFERRED EMBODIMENT

Figure 1:
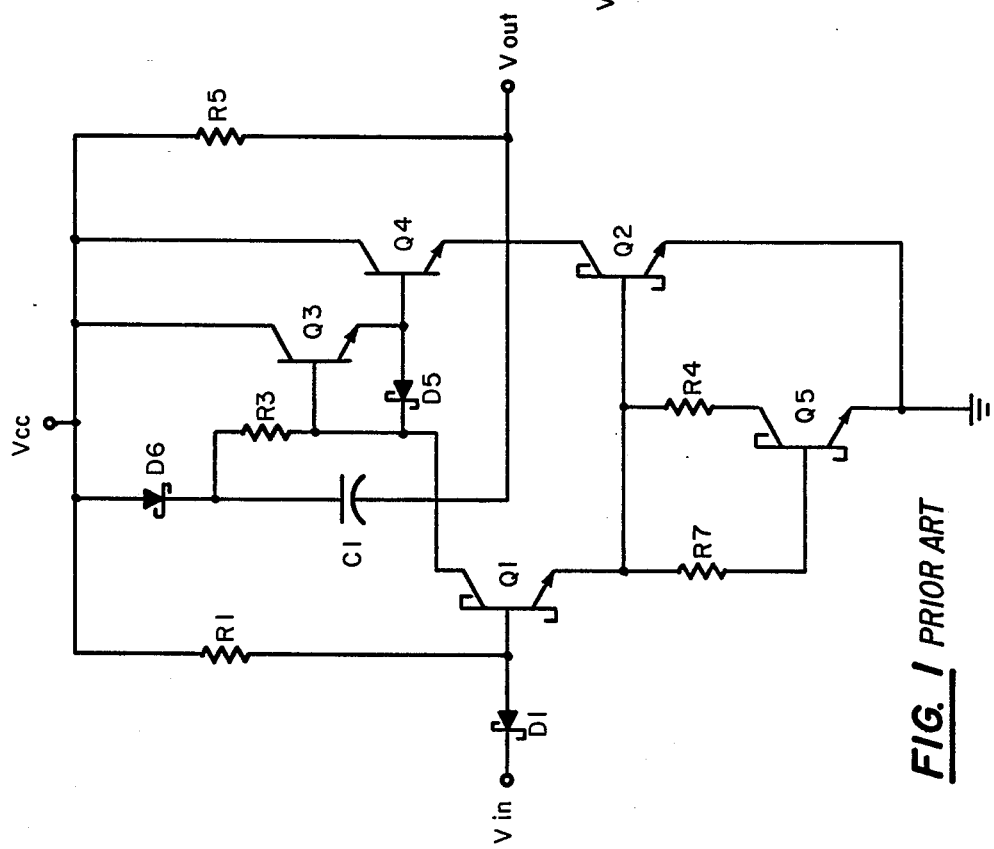
FIG. 1 is a schematic diagram of a typical TTL logic output circuit for driving a capacitive load.

FIG. 1 illustrates a logic output circuit having a bootstrapped output operation that is particularly suited for driving a highly capacitive load such as a MOS circuit. The circuit of FIG. 1 is representative of a presently-available TTL logic device having an input terminal where a multi-state input signal $V_{in}$ is applied. The input signal conventionally comprises a binary logic signal having two states. Typically, a first, or lower state of the input signal comprises a low level voltage, for example, less than 0.7 volts. The second, or upper state of the signal is typically a high level voltage having a magnitude greater than 2.5 volts. The FIG. 1 circuit inverts the input signal to provide, at an output port, an output signal $V_{out}$ that is the complement of the input signal $V_{in}$.

The input signal $V_{in}$ is gated into the circuit of FIG. 1 by a diode $D_1$. When $V_{in}$ is in its second or high state, it reverse biases the diode $D_1$ which causes the base of the phase-splitter transistor $Q_1$ to rise toward $V_{cc}$ through $R_1$. $Q_1$ conducts emitter current from the source $V_{cc}$ through the diode $D_6$, the resistor $R_3$, and into the base of a sink transistor $Q_2$. A conventional squaring network comprising the resistors $R_4$, $R_7$ and $Q_5$ is connected between the base of the output transistor $Q_2$ and ground.

After $Q_1$ turns on, the capacitor $C_1$ charges through $D_6$ and $Q_2$ to a voltage $V_c = V_{cc} - V_{D6} - V_{Q2sat}$. At the same time, the voltage drop across $Q_1$ and the base-emitter junction of $Q_2$ keeps the base of $Q_3$ at the same potential as its emitter, which keeps $Q_3$ turned off. With $Q_3$ off, $Q_4$ receives no base current and is also kept off.

When the input signal $V_{in}$ transitions from its high to its low state, the diode $D_1$ becomes forward biased. This lowers the potential at the base of $Q_1$, thereby turning it off. When $Q_1$ turns off, the voltage at the base of $Q_3$ begins to rise toward $V_{cc}$ through $R_3$, and $Q_3$ begins to conduct. When $Q_3$ conducts, its base current is supplied from the charge on $C_1$. When $Q_3$ turns on, it supplies a base current to turn on a current source, or pull-up transistor $Q_4$. $Q_4$ conducts long enough to charge up the capacitance of the load connected to the output terminal, and then shuts off.

It should be evident to one acquainted with logic devices that $Q_2$ and $Q_4$ constitute the familiar "totempole" arrangement that is conventionally used in the output circuits of TTL devices.

When $Q_1$ is shut off by the input signal going from a high to a low level, it stops supplying base current to $Q_2$. This does not, however, promptly turn off $Q_2$, since its parasitic base capacitance discharges slowly through the squaring network connected to the base of the output transistor $Q_2$. Part of this discharge current is diverted through the base-emitter junction of $Q_2$ where it is multiplied by the current gain of the transistor. During the time that the parasitic capacitance is discharging, the output transistor $Q_2$ continues to conduct a forward current as a result of the diverted discharge current. This causes the FIG. 1 circuit to unnecessarily consume power during the transition of the output signal from a low to a high state. Furthermore, it slows the output signal transition, because $Q_2$ remains on while its base capacitance discharges.

To complete the description of the operation of the circuit when the signal $V_{in}$ transitions from its low to its high state, the diode $D_1$ is turned off, the base of $Q_1$ rises toward $V_{cc}$, $Q_1$ begins to conduct and its collector voltage begins to fall. The lowered collector voltage of $Q_1$ forward biases $D_6$ and $D_5$ and turns off $Q_3$ and $Q_4$, thus switching off the current source for the output terminal.

At the same time that the pull-up transistor $Q_4$ is turned off, the forward current of the phase-splitter $Q_1$ is provided to the base of the output transistor $Q_2$, turning it on. When $Q_2$ turns on, it sinks current from the load capacitance connected to the output terminal. Further, the forward current through $Q_2$ charges the bootstrap capacitor $C_1$ through the forward biased diode $D_6$. However, since $Q_1$ turns on $Q_5$ simultaneously with $Q_2$, a portion of the $Q_2$ base current is diverted, thus slowing the turn-on time of $Q_2$ and the fall time of $V_{out}$.

Figure 4:
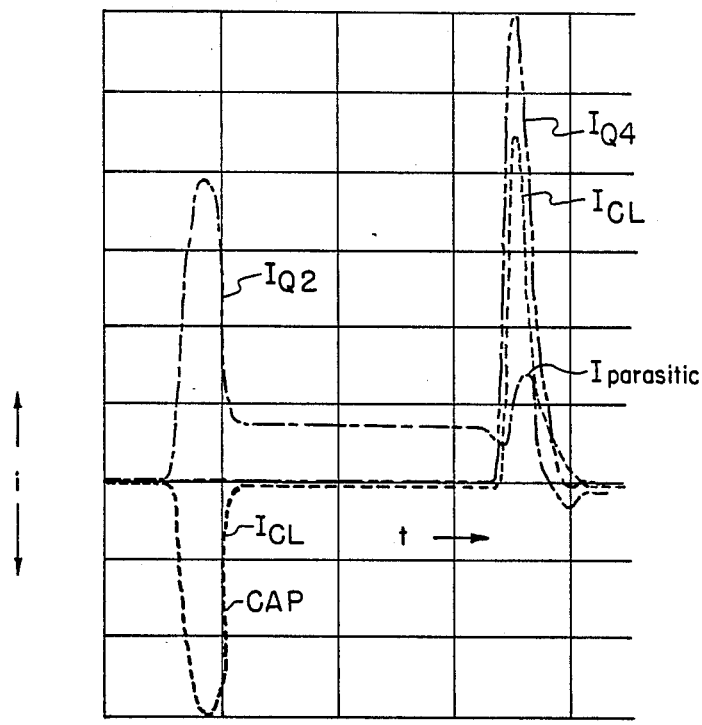
FIG. 4 is a waveform diagram representing the currents drawn by various components of the FIG. 1 circuit.

FIG. 4 illustrates the effect of discharging the parasitic capacitance in $Q_2$ by the circuit of FIG. 1. In FIG. 4 the current waveform for the output transistor $Q_2$ is labelled $I_{Q2}$. When the input voltage transitions positively, $Q_2$ turns on to sink charging current for the load capacitance $C_L$. The current for the capacitance is labelled $I_{CL}$. After $I_{CL}$ has subsided, there is a residual current which flows through the emitter of the output transistor $Q_2$. This residual current results from current in the base circuit of the output transistor $Q_2$ being diverted through the $Q_2$ Schottky diode which parallels the base-collector junction of $Q_2$. The current is diverted into the collector of $Q_2$ and flows therefrom to the emitter.

When the negative-going transition of the input signal occurs and the pull-up transistor $Q_4$ is turned on; it provides a current $I_{Q4}$ which provides for charge transfer onto the load capacitance $C_L$. In addition, it must provide an extra margin of current, $I_{parasitic}$ to the collector of $Q_2$ when $Q_1$ no longer supplies base current to $Q_2$, but while the parasitic capacitance of $Q_2$ is still discharging and keeping $Q_2$ turned on. As stated above, $I_{parasitic}$ flows until the parasitic capacitance of $Q_2$ has been fully discharged.

Figure 2:
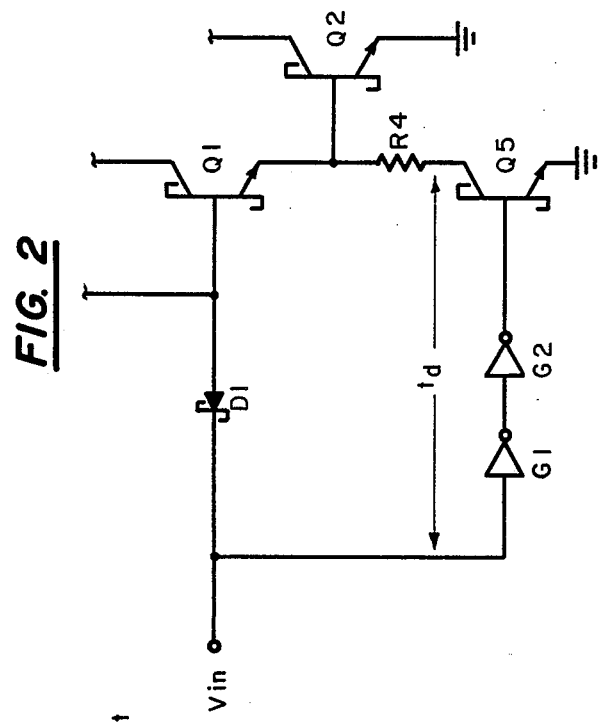
FIG. 2 is a partial block diagram of a TTL logic output circuit incorporating the concept of the invention.

Reference to FIG. 2 provides an understanding of how the circuit of FIG. 1 can be improved according to the principles of the invention. The improvement results in speeding up the output transition times of the circuit and reducing its total power consumption. In FIG. 2 elements $D_1$, $Q_1$, $Q_2$ and $Q_5$ correspond to identically-designated elements in FIG. 1. Further, it is understood that in FIG. 2, other elements that are not shown but that correspond to elements in FIG. 1 are connected to the base and collector of $Q_1$ and to the collector of $Q_2$.

In FIG. 2, the base of $Q_5$ has been disconnected from the emitter of $Q_1$ and reconnected, through a pair of conventional inverters or gates, $G_1$ and $G_2$, to the input terminal. This enables $Q_5$ to operate in response to the input signal $V_{in}$. However, the response of $Q_5$ to the input signal is delayed by a time $t_d$ that is equivalent to the aggregate switching time of the gates $G_1$ and $G_2$. In operation, when $V_{in}$ has a positive transition, $Q_1$ turns $Q_2$ on immediately by provision of current to the base of $Q_2$. The provision of the positive transition of $V_{in}$ to $Q_5$ is delayed by the gates $G_1$ and $G_2$. With proper selection of gate switching times, $t_d$ can be sufficient to keep $Q_5$ off during most of the rise time of $V_{in}$. This will result in all of $Q_1$'s emitter current being provided to drive $Q_2$ during the transition; thus, $Q_2$ will be driven on more quickly than if part of its base current were diverted through $Q_5$. The result is a quicker fall time for the output voltage $V_{out}$. When the delayed positive transition of $V_{in}$ turns $Q_5$ on, the load capacitance will have been discharged, $V_{out}$ will have assumed its low level, and the forward current required of $Q_2$ will be minimal. Thus, diversion of base current from $Q_2$ through $Q_5$ only after the circuit has changed state will not affect the fall time of $V_{out}$. When $Q_5$ is turned on, $R_4$ sets the quiescent operating level for $Q_2$.

Next, when $V_{in}$ has a negative transition, $Q_5$ will be kept on for the period $t_d$ after the transition. The period of time $Q_5$ is kept on permits it to conduct all of the current required to discharge $Q_2$'s base-collector capacitance. $Q_2$ is thereby disabled from conducting any forward current due to diversion of the discharge current through its base-emitter junction. This turns $Q_2$ off quickly and prevents any collector current being drawn by $Q_2$ from $Q_4$. This speeds up the positive transition of the output signal and reduces the power consumed by the FIG. 2 circuit.

Figure 3:
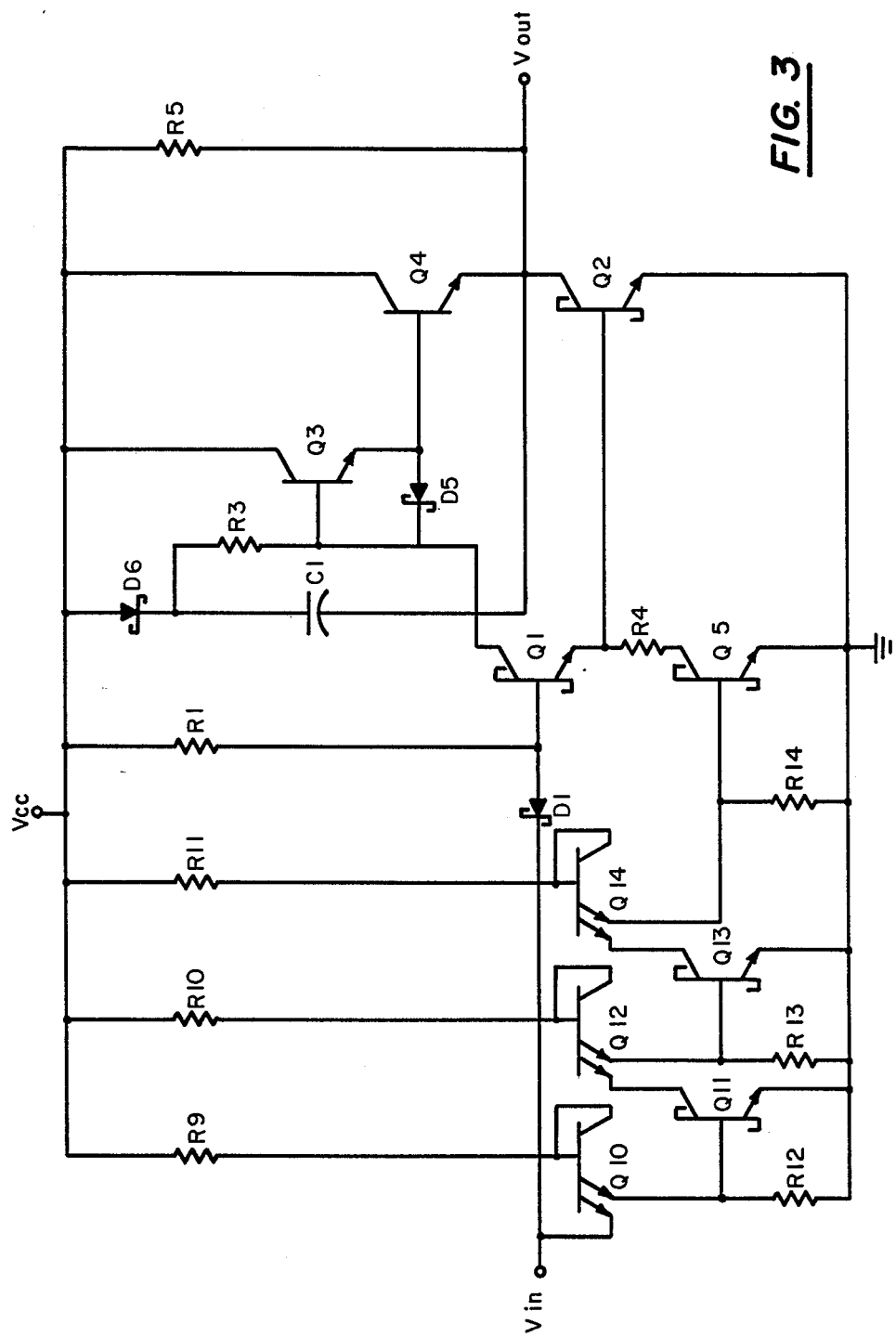
FIG. 3 is a circuit diagram of a TTL logic output circuit which includes a speed-up circuit operating according to the concept of the invention.

The concept illustrated in FIG. 2 is preferably implemented by the circuit of FIG. 3 where elements that correspond to similar elements in the FIG. 1 circuit bear the same identifying designations. However, transitors $Q_{10}$–$Q_{14}$, together with resistors $R_9$–$R_{14}$ have been added to the FIG. 1 circuit. Further, as shown in FIG. 2, the base of $Q_5$ has been disconnected from the emitter $Q_1$ and connected across $R_{14}$ to one of the emitters of $Q_{14}$. This alters the role of $Q_5$ to that of a switched current device which provides a discharge path for the base-collector capacitance of the sink transistor $Q_2$. Further, the operation of $Q_5$ is synchronized with the operation of the output pair $Q_4$ and $Q_2$ so that it does not conduct while the sink transistor is being turned on, but does conduct precisely when $Q_2$ is being turned off.

In operation, when the input voltage signal is initially in a low state, $Q_4$ will conduct and provide current as needed, while the level of the output voltage will be high because $Q_2$ is off. At the same time, the emitter of $Q_{10}$ that is connected to the input node is forward biased, which lowers the voltage at the base-emitter junction of $Q_{10}$, turning off the emitter tied to $R_{12}$. This prevents base current flowing to $Q_{11}$ and turns off the $Q_{12}$ emitter that is tied to the collector of $Q_{11}$. This raises the voltage at the base of $Q_{12}$ to a point where its second emitter begins to conduct, providing base current to $Q_{13}$ and turning it on. With $Q_{13}$ conducting, the first emitter of $Q_{14}$ is forward biased and the second emitter is turned off, which keeps $Q_5$ turned off.

When the input voltage signal undergoes a positive transition from a low to a high state, the first emitter of $Q_{10}$ turns off, the second emitter turns on and provides base current to $Q_{11}$. The base current turns $Q_{11}$ on, forward biasing the first emitter of $Q_{12}$, while turning off the second emitter. When the second emitter of $Q_{12}$ turns off, the base current to $Q_{13}$ is turned off, causing the collector voltage of $Q_{13}$ to rise and turn off the first emitter of $Q_{14}$. As a result of the first emitter turning off, the second emitter of $Q_{14}$ begins to conduct and provide base current to $Q_5$. This turns $Q_5$ on and diverts a portion of the emitter current of $Q_1$ away from the base of $Q_2$ and through $Q_5$. When $Q_5$ becomes fully conducting, the resistor $R_4$ sets the quiescent current level through $Q_2$. Preferably, the value of the resistor $R_4$ is kept at a low value, for example, 30 ohms.

It should be evident that the sequential switching action of the transistors $Q_{10}$–$Q_{14}$ delays the delivery of the rising edge of the input voltage signal to $Q_5$ so that $Q_5$ is turned on after $Q_1$, the delay being established by the switching times of the transistors $Q_{10}$–$Q_{14}$. Thus, the concept of the FIG. 2 circuit is implemented in FIG. 3 with $G_1$ corresponding to $Q_{10}$, $Q_{11}$ and $Q_{12}$ and $G_2$ to $Q_{13}$ and $Q_{14}$. Thus, in FIG. 3, when the positive-going edge of the input signal voltage level turns $Q_1$ on, the full measure of its emitter current is available to drive $Q_2$ into conduction since $Q_5$ is not conducting at this time. After the delay established by the transistors $Q_{10}$–$Q_{14}$, $Q_5$ begins to conduct and so diverts a portion of the $Q_1$ emitter current from the base of $Q_2$. However, with proper selection of the delay components, the delay in switching $Q_5$ on can be made long enough to divert none of the emitter current of $Q_1$ from the base of $Q_2$ during the transition of the output signal voltage level. This will permit the output transistor $Q_2$ to switch quickly to a high level of forward current operation and lower the level of $V_{out}$ and will enable it to quickly transfer the charge on the load capacitance. Then, when the load capacitance charge has been fully transferred and the required forward current capacity of $Q_2$ has dropped, $Q_5$ will switch on and divert a portion of the base current of $Q_2$.

When the level of the input voltage signal transitions in a negative direction, the current sourcing transistor $Q_4$ is turned on and the sink transistor $Q_2$ is turned off as described above. At the same time, the transistor $Q_{10}$ begins to switch conduction from its second to its first emitter, which turns off $Q_{11}$. This switches conduction from the first to the second emitter of $Q_{12}$, turns on $Q_{13}$, and forward biases the first emitter of $Q_{14}$. As stated above, when the first emitter of $Q_{14}$ is forward biased, the second emitter turns off, removing the base current from $Q_5$ and turning it off. However, the switching actions of the transistors $Q_{10}$–$Q_{14}$ delay the turn-off of $Q_5$ during the transition of the input voltage signal level so that the base-collector capacitance of the output transistor $Q_2$ can fully discharge through $Q_5$ before $Q_5$ turns off.

Figure 5:
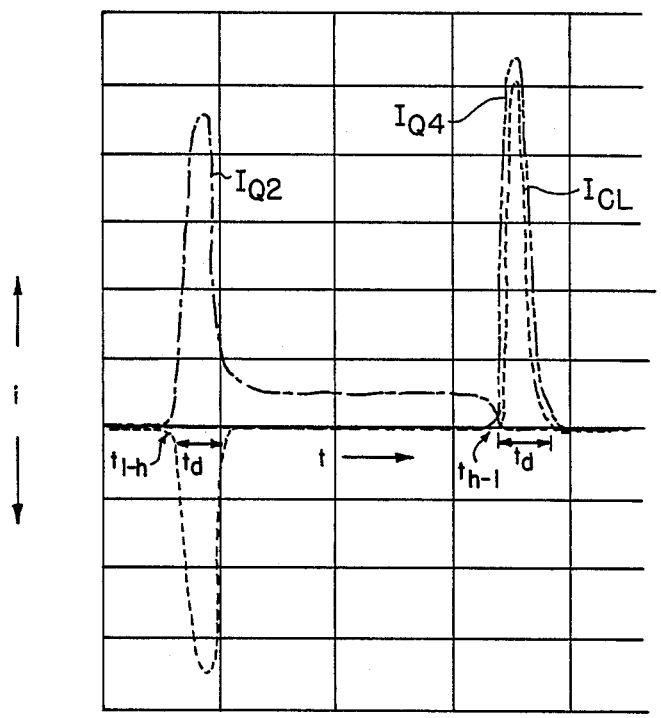
FIG. 5 is a waveform diagram illustrating the currents drawn by various elements of the FIG. 3 circuit.

The effect of the delay circuit on the operation of the totem-pole transistors of the output logic circuit is illustrated in FIG. 5. As shown, the current surge $I_{Q2}$ through the output transistor $Q_2$ during the low-to-high input signal transition at time $t_{1-h}$ occurs largely to sink a current $I_{CL}$ which transfers the charge on the load capacitance. With the turn-on of transistor $Q_5$ delayed, all of the forward current from the phase-splitter $Q_1$ is available to rapidly drive the output transistor $Q_2$ to a high current conduction level. When $Q_5$ turns on after the delay $t_d$ imposed by the transistors $Q_{10}$–$Q_{14}$, the charge on the capacitance has largely been transferred, reducing the current demand on $Q_2$. Thus, when $Q_5$ turns on it does not affect the turn-on switching time of the output transistor $Q_2$.

When the input signal begins to transition from a high to a low level at time $t_{h-1}$ the sink transistor $Q_2$ is turned completely off, with its base-collector capacitance discharging through $Q_5$ (which does not turn off until the switching delay time $t_d$ has expired). This speeds up the transition of the output voltage signal. In addition, the total current $I_{Q4}$ drawn by the current-sink transistor $Q_4$ is reduced to that necessary only to retransfer the charge on the circuit and load capacitances. $Q_4$ does not have to provide forward current to $Q_2$ since $Q_2$'s parasitic capacitance has been quickly discharged through $Q_5$. As shown in FIG. 5, $Q_2$ draws no current while $Q_4$ is conducting, which reduces the total AC power drawn by the output circuit.

Obviously, many modifications and variations of the present invention are possible in light of the above teachings, and it is therefore understood that within the scope of the disclosed inventive concept, the invention may be practiced otherwise then as specifically described.

We claim:

1. A logic circuit operable from first and second supply terminals connectable to a source of operating power and having an input terminal for receiving a multistate input signal and an output terminal to which a capacitive load is connected for receiving an output signal, said circuit comprising:

phase splitter means connected to said input terminal and responsive to said input signal for providing a signal current when said input signal changes from a first to a second respective state and for removing said signal current when said input signal changes from said second to said first state;

a sink transistor having a collector connected to said output terminal, an emitter connected to said second supply terminal, and a base connected to receive said signal current for turning said sink transistor on to conduct current from said output terminal through said collector and emitter to said second supply terminal when said signal current is provided and for turning said sink transistor off when said signal current is removed;

switchable current path means responsive to said input signal for, when said input signal changes from said first to said second state, being switched to a first condition connecting a path across said sink transistor base and emitter terminals and for, when said input signal changes from said second to said first state, being switched to a second condition removing said current path; and delay means connected between said input terminal and said current path means for maintaining said current path means in said first or said second condition for a predetermined amount of time after said input signal changes states.

2. The circuit of claim 1 wherein said delay means delays the provision of said input signal to said current path means.

3. The circuit of claim 1 wherein, when said input signal changes from said second to said first state, said delay means delays said input signal change for an amount of time sufficient to maintain said current path means in said first condition and discharge a parasitic capacitance of said sink transistor through said current path.

4. The circuit of claim 1 wherein, when said input signal changes from said first to said second state, said delay means delays said input signal change for an amount of time sufficient to maintain said current path means in said second condition while said sink transistor is discharging a load capacitance connected to said output terminal.

5. The circuit of claim 4 wherein, when said input signal changes from said second to said first state, said delay means delays said input signal change for another amount of time sufficient to maintain said current path means in said first condition and discharge a parasitic capacitance of said sink transistor through said current path.

6. The circuit of claim 1 wherein said switchable current means comprise a transistor having its collector and emitter electrodes respectively connected between said sink transistor base and emitter for alternately assuming a conducting or a non-conducting state in accordance with said input signal connected to the base of said transistor through said delay means.

7. The circuit of claim 6 wherein said switchable current path means further includes, in series with said transistor means, a resistor for establishing a quiescent current level for said sink transistor.

8. The circuit of claim 1 wherein said delay means comprises logic gate means for delaying the provision of said input signal change to said current path means by an amount of time required for said gate means to operate.

9. The circuit of claim 8 wherein said logic gate means includes a pair of logic inverters connected in series between said input terminal and said current path means.

10. The circuit of claim 9 wherein said switchable current path means comprises a transistor means connected between said sink transistor base and a DC potential for alternately assuming a conducting or a non-conducting state in accordance with said input signal connected through said inverters.

11. The circuit of claim 10 wherein said switchable current path means further includes, in series with said transistor means, a resistor for establishing a quiescent current level for said sink transistor.

12. A logic driver circuit operable from first and second supply terminals connectable to a source of operating power and responsive to a multistate input signal for providing an output signal to an output terminal, said circuit comprising:

an output sink transistor having a collector connected to said output terminal, an emitter connected to said second supply terminal and a base connected to receive said input signal and providing said output signal in response to a base current signal applied to said base;

an output control means responsive to said input signal for providing said base current signal when said input signal has a first respective transition and for removing said base current signal when said input signal has another respective transition;

switched current path means coupled across said emitter and base terminals of said output sink transistor and responsive to said input signal for providing a current path for conducting current away from said base at said first transition and for removing said current path at said second transition; and means for delaying the provision of said input signal to said switched current path means for an amount of time after said input signal is provided to said input control means.

* * * * *